(12) United States Patent
Chang et al.

(10) Patent No.: US 11,451,207 B1
(45) Date of Patent: Sep. 20, 2022

(54) COMMON MODE FILTER

(71) Applicant: HTC Corporation, Taoyuan (TW)

(72) Inventors: Che-Jung Chang, Taoyuan (TW);
Wei-Hong Gao, Taoyuan (TW);
Chia-Chu Ho, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 17/197,027

(22) Filed: Mar. 10, 2021

(51) Int. Cl.
*H03H 7/01* (2006.01)
*H03H 7/42* (2006.01)
*H03H 1/00* (2006.01)
*H05K 1/02* (2006.01)

(52) U.S. Cl.
CPC .......... *H03H 7/0115* (2013.01); *H03H 7/427* (2013.01); *H05K 1/0216* (2013.01); *H05K 1/0245* (2013.01); *H05K 2201/09036* (2013.01)

(58) Field of Classification Search
CPC ..... H03H 1/0007; H03H 7/0115; H03H 7/427
USPC .......................................... 333/175, 181, 185
See application file for complete search history.

(56) References Cited

U.S. PATENT DOCUMENTS 10,411,670 B2 *   9/2019  Xing ..................... H05K 3/0017
2013/0278355 A1 * 10/2013  Shibata .................. H03H 7/427
                                                          333/181

* cited by examiner

*Primary Examiner* — Rakesh B Patel
(74) *Attorney, Agent, or Firm* — JCIPRNET

(57) ABSTRACT

A common mode filter is disposed on a circuit board. A signal layer of the circuit board has a differential signal wire pair. The common mode filter has a slot structure and a filtering frequency adjusting device. The slot structure is formed on a reference voltage layer of the circuit board, wherein the slot structure surrounds the differential signal wire pair. The filtering frequency adjusting device is disposed on a corner part of the slot structure, wherein the filtering frequency adjusting device includes at least one of at least one capacitor and at least one inductor, and is disposed on the circuit board across the differential signal wire pair.

9 Claims, 6 Drawing Sheets

COMMON MODE FILTER

BACKGROUND

Technical Field

The invention relates to a common mode filter, and particularly relates to a common mode filter disposed on a printed circuit board and capable of performing filtering frequency adjustment.

Description of Related Art

In the conventional technical field, in a common mode filter generated through a circuit layout, a center frequency of a passband thereof is often controlled by a length of a slot structure on a circuit board and a length of a transmission wire. In this way, when a peripheral circuit applied to the circuit board changes, a designer needs to redesign the layout of the slot structure and the transmission wire, which increases the time course of design. In addition, the formation of the slot structure needs to match the topography of the layout of the circuit board. In a limited space, it is probably unable to produce a suitable slot structure effectively, and may cause poor performance in impedance matching.

SUMMARY

The invention is directed to a common mode filter, which is adapted to dynamically adjust a signal passband.

The invention provides a common ode filter disposed on a circuit board. A signal layer of the circuit board has a differential signal wire pair. The common mode filter includes a slot structure and a filtering frequency adjusting device. The slot structure is formed on a reference voltage layer of the circuit board, wherein the slot structure surrounds the differential signal wire pair. The filtering frequency adjusting device is configured above a bent part of the slot structure, wherein the filtering frequency adjusting device includes at least one of at least one inductor and at least one capacitor, and is configured on the circuit board across the differential signal wire pair.

Based on the above description, in the common mode filter of the invention, by arranging the filtering frequency adjusting device on the slot structure of the circuit board, and dynamically adjusting a passband of the common mode filter through a capacitor and/or an inductor on the filtering frequency adjusting device, efficiency of the common mode filter is improved.

DESCRIPTION OF THE EMBODIMENTS

Figure 1:
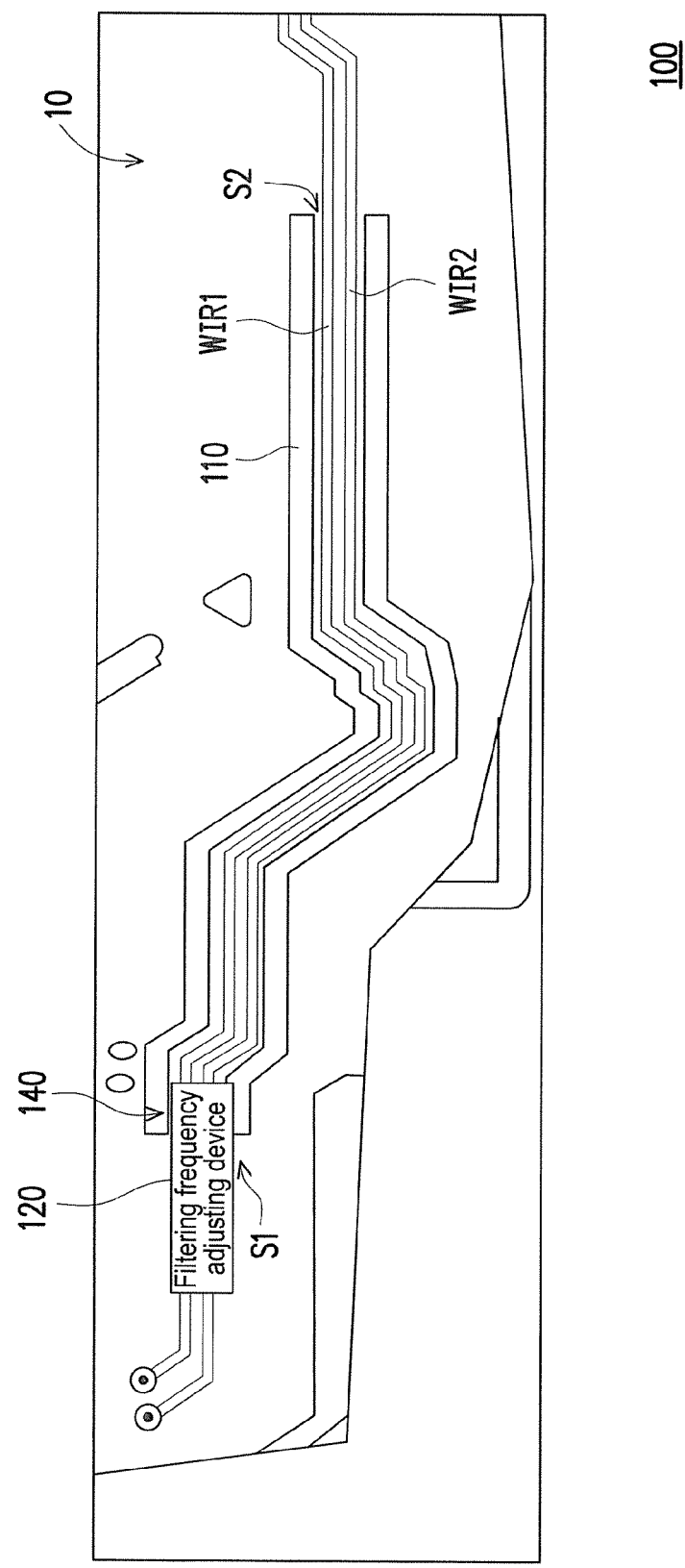
FIG. 1 is a schematic diagram of a common mode filter according to an embodiment of the invention.

Referring to FIG. 1, FIG. 1 is a schematic diagram of a common mode filter according to an embodiment of the invention. The common mode filter 100 of the embodiment of the invention is disposed on a circuit board 10. An active layer of the circuit board 10 is provided with a differential signal wire pair composed of differential signal wires WIR1 and WIR2. The common mode filter 100 includes a slot structure 110 and a filtering frequency adjusting device 120. The slot structure 110 is disposed on a reference voltage layer of the circuit board 10, where the reference voltage layer and the active layer may be located in different layers of the circuit board 10, and the reference voltage layer and the active layer may be overlapped with each other. The reference voltage layer may be electrically coupled to a ground voltage or a power supply voltage, and may be used as a reference plane for a differential signal pair transmitted by the differential signal wires WIR1 and WIR2.

It should be noted that in the embodiment, the slot structure 110 is configured by surrounding the differential signal wires WIR1 and WIR2. In the embodiment, the slot structure 110 has a bent part 140 at a first side S1, and the slot structure 110 has an opening portion at a second side S2. The filtering frequency adjusting device 120 may cover the bent part 140 located at the first side S1 of the slot structure 110.

In an embodiment of the invention, the filtering frequency adjusting device 120 may have one or a plurality of capacitors. In another embodiment of the invention, the filtering frequency adjusting device 120 may have one or a plurality of inductors. In still another embodiment of the invention, the filtering frequency adjusting device 120 may have one or a plurality of capacitors and one or a plurality of inductors.

It should be noted that the filtering frequency adjusting device 120 may be disposed on the circuit board 10 in a manner of surface mount device (SMD). The filtering frequency adjusting device 120 may be electrically connected to the reference voltage layer through a conductive via on the circuit board 10, where the reference voltage layer may be a reference ground layer in the circuit board 10.

Figure 2:
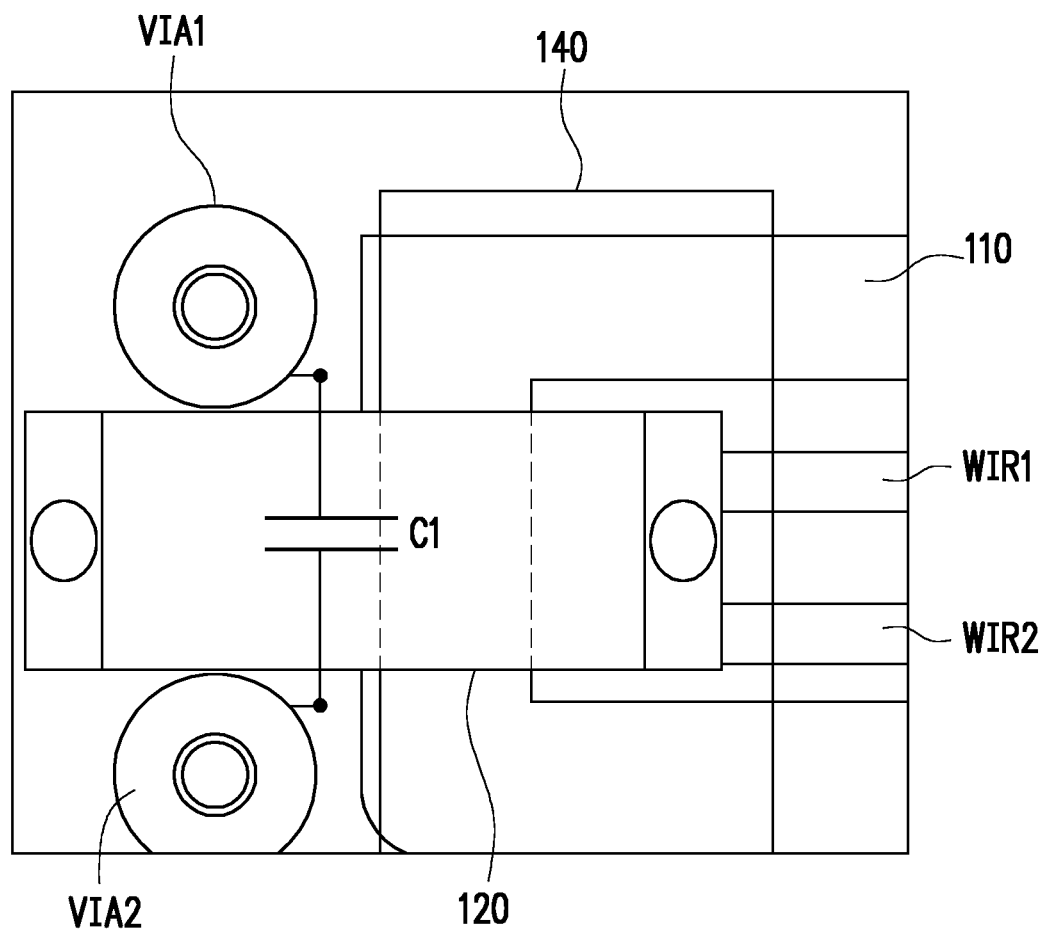
FIG. 2 is a partial enlarged schematic diagram of a common mode filter 100 according to the embodiment of FIG. 1 of the invention.

Referring to FIG. 2, FIG. 2 is a partial enlarged schematic diagram of the common mode filter 100 according to the embodiment of FIG. 1 of the invention. A situation that the filtering frequency adjusting device 120 includes a capacitor C1 is taken as an example for description. Two ends of the capacitor C1 are respectively connected to the reference voltage layer of the circuit board 10 through conductive vias VIA1 and VIA2 on the circuit board 10. In addition, the filtering frequency adjusting device 120 is disposed above a bent part 140 of the slot structure 110.

It should be noted that the filtering frequency adjusting device 120 of the embodiment of the invention may be detachably disposed on the circuit board 10. To be specific, according to application conditions of the circuit board 10, in response to different peripheral circuit settings and a frequency of the transmitted differential signal pair, a designer may select a suitable filtering frequency adjusting device 120 for soldering on the circuit board 10. When the application conditions of the circuit board 10 are changed, the designer does not need to change an overall layout of the circuit board, and only needs to disassemble and replace with the appropriate filtering frequency adjusting device 120 to achieve impedance matching.

Figure 3A:
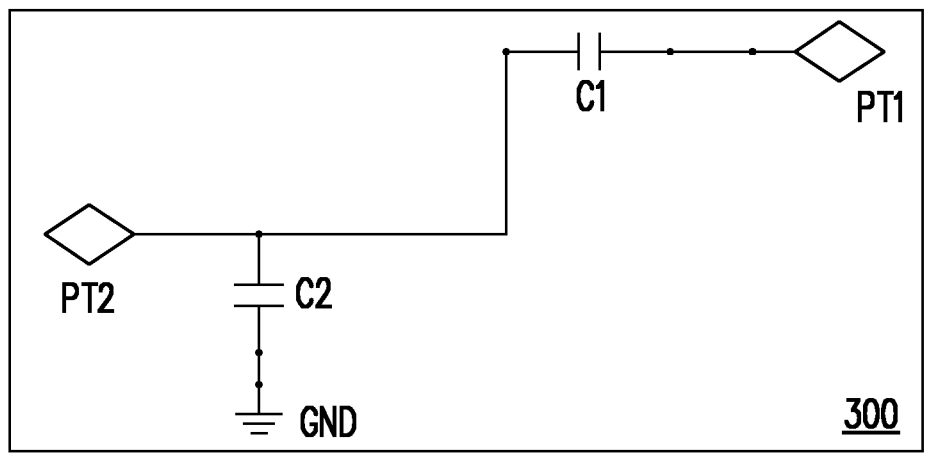
FIG. 3A is a schematic diagram of an implementation of a filtering frequency adjusting device of a common mode filter according to an embodiment of the invention.
Figure 3B:
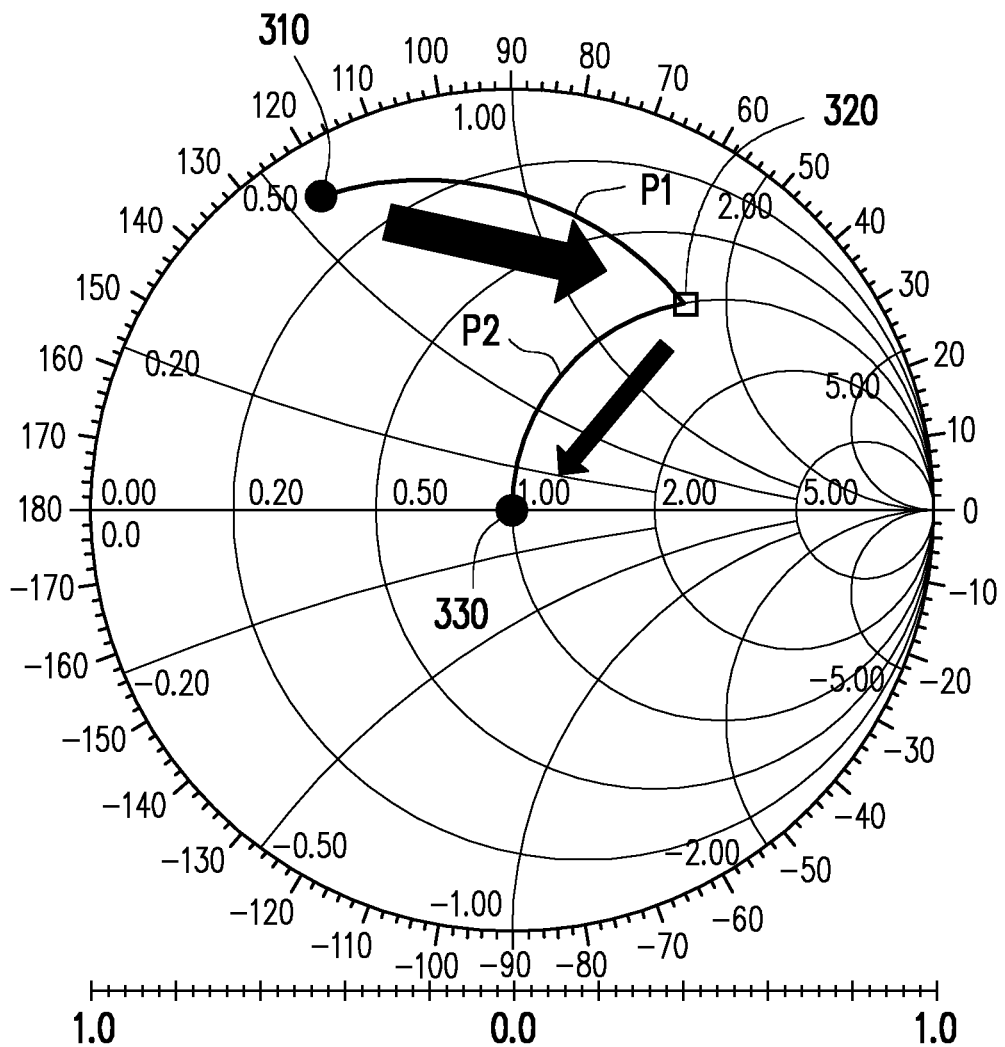
FIG. 3B illustrates a Smith chart of the implementation of FIG. 3A.

Referring to FIG. 3A and FIG. 3B below, where FIG. 3A is a schematic diagram of an implementation of a filtering frequency adjusting device of a common mode filter according to an embodiment of the invention, and FIG. 3B illustrates a Smith chart of the implementation of FIG. 3A. In FIG. 3A, a filtering frequency adjusting device 300 includes a capacitor C1 and a capacitor C2. The capacitor C1 is connected between a connection port PT1 and a connection port PT2. The capacitor C2 is connected between the connection port PT2 and a reference ground terminal GND. Referring to the Smith chart in FIG. 3B, before the filtering frequency adjusting device 300 is added, an equivalent impedance value of a transmission wire may fall at a position 310 in the Smith chart. After the filtering frequency adjusting device 300 is added, the capacitor C1 may make the equivalent impedance value of the transmission wire to move to a position 320 through a path P1, and the capacitor C2 may make the equivalent impedance value of the transmission wire to move to a position 330 through a path P2, and complete the design of impedance matching.

Figure 4A:
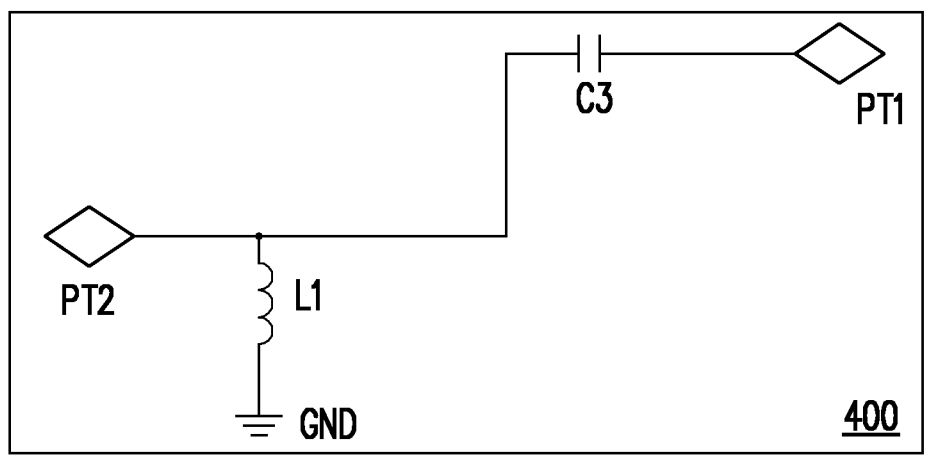
FIG. 4A is a schematic diagram of another implementation of a filtering frequency adjusting device of a common mode filter according to an embodiment of the invention.
Figure 4B:
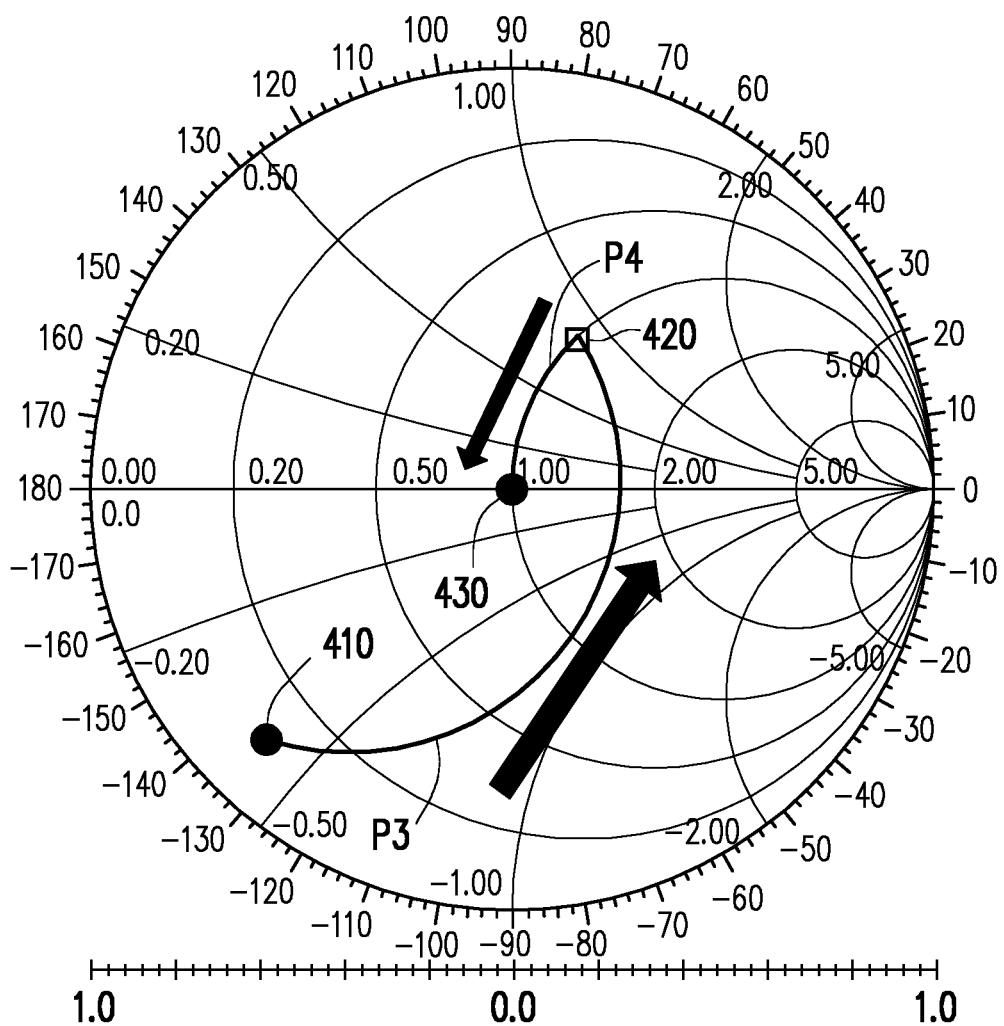
FIG. 4B illustrates a Smith chart of the embodiment of FIG. 4A.

Referring to FIG. 4A and FIG. 4B below, where FIG. 4A is a schematic diagram of another implementation of a filtering frequency adjusting device of a common mode filter according to an embodiment of the invention, and FIG. 4B illustrates a Smith chart of the embodiment of FIG. 4A. In FIG. 4A, a filtering frequency adjusting device 400 includes a capacitor C3 and an inductor L1. The capacitor C3 is connected between the connection port PT1 and the connection port PT2. The inductor L1 is connected between the connection port PT2 and the reference ground terminal GND. Referring to the Smith chart of FIG. 4A, before the filtering frequency adjusting device 400 is added, the equivalent impedance value of the transmission wire may fall at a position 410 in the Smith chart. After the filtering frequency adjusting device 400 is added, the capacitor C3 may make the equivalent impedance value of the transmission wire to move to a position 420 through a path P3, and the inductance L1 may make the equivalent impedance value of the transmission wire to move to a position 430 through a path, and complete the design of impedance matching.

According to the implementations of FIG. 3A and FIG. 4A, it is known that in response to original impedance states of the transmission wire of different states, an adjustment operation of impedance matching of the common mode filter of the embodiment of the invention may be effectively completed by replacing with the suitable filtering frequency adjusting device 400, and a reflection phenomenon that probably occurs in signal transmission is effectively reduced, and signal transmission quality is enhanced.

Figure 5:
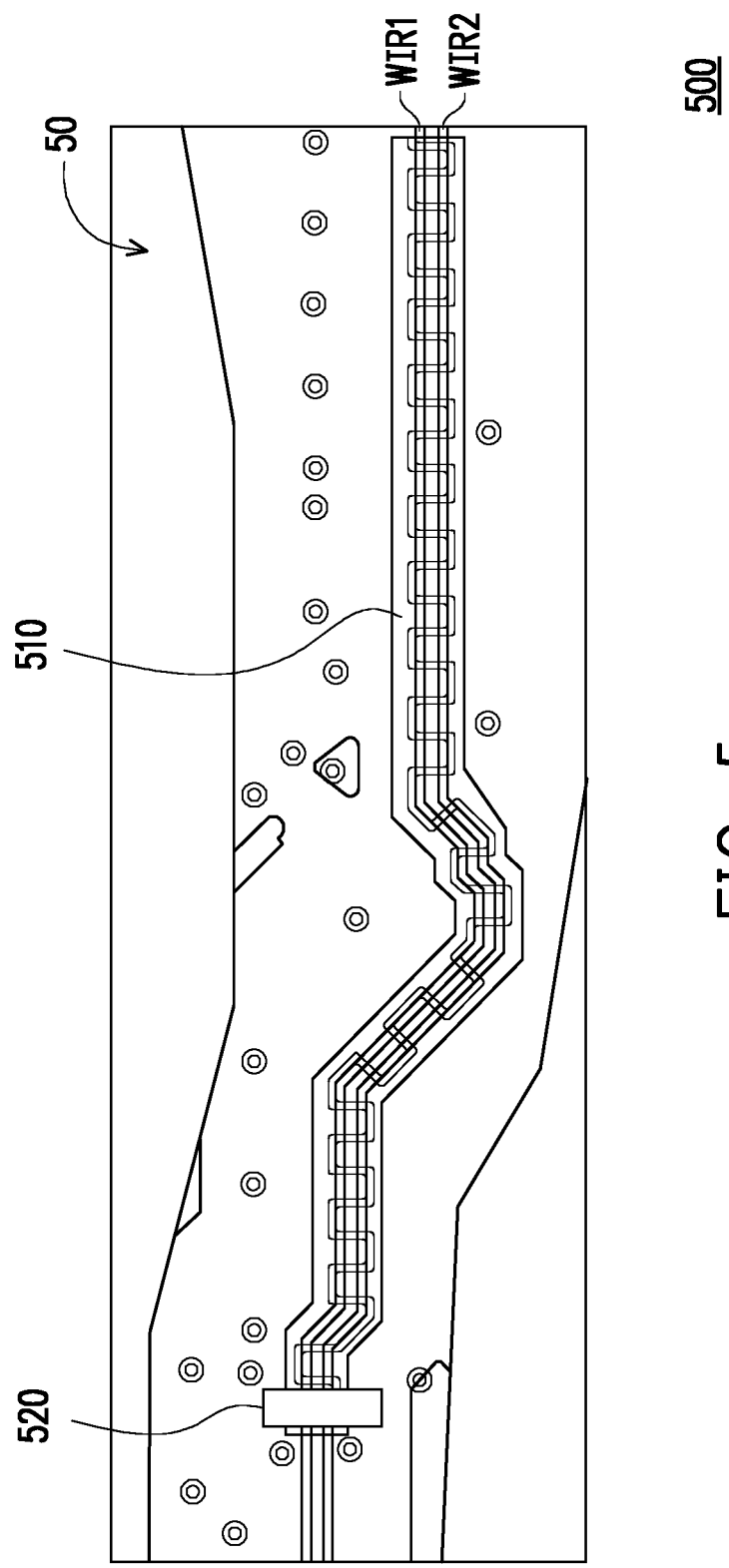
FIG. 5 is a schematic diagram of a common mode filter according to another embodiment of the invention.

Referring to FIG. 5, FIG. 5 is a schematic diagram of a common mode filter according to another embodiment of the invention. A common mode filter 500 of the embodiment of the invention is disposed on a circuit board 50. An active layer of the circuit board 50 is provided with a differential signal wire pair composed of differential signal wires WIR1 and WIR2. The common mode filter 500 includes a slot structure S10 and a filtering frequency adjusting device 520. The slot structure S10 is disposed on a reference voltage layer of the circuit board 50, where the reference voltage layer and the active layer may be located in different layers of the circuit board 50, and the reference voltage layer and the active layer may be overlapped with each other. The reference voltage layer may be electrically coupled to the ground voltage or the power supply voltage, and may be used as a reference plane for the differential signal pair transmitted by the differential signal wires WIR1 and WIR2.

It should be noted that in the embodiment, the slot structure S10 is configured by surrounding the differential signal wires WIR1 and WIR2. Compared to the embodiment of FIG. 1, the slot structure S10 may have a shape different from that of the slot structure 110. In the embodiment, the slot structure S10 has a plurality of curved insulating structures. The differential signal wires WIR1 and WIR2 may be configured on the curved insulating structures and the slot structure S10.

It should be noted that in the embodiment of the invention, the shape of the slot structure S10 is not fixedly restricted, and the designer may adjust the shape of the slot structure S10 according to an actual layout state.

Figure 6:
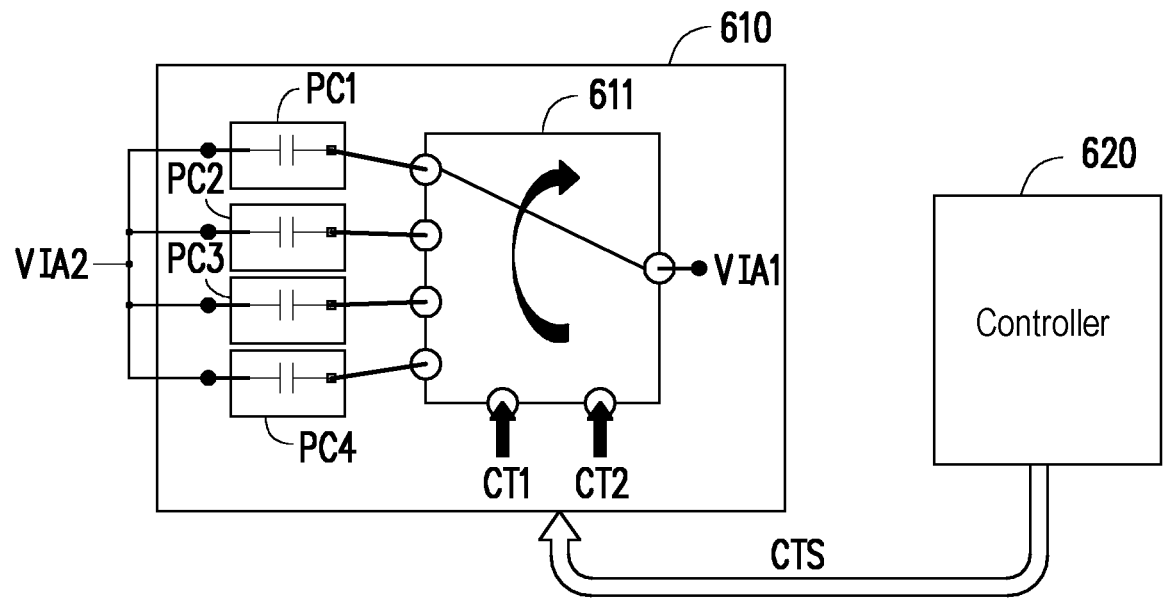
FIG. 6 is a schematic diagram of another implementation of a filtering frequency adjusting device of a common mode filter according to an embodiment of the invention.

Referring to FIG. 6, FIG. 6 is a schematic diagram of another implementation of a filtering frequency adjusting device of a common mode filter according to an embodiment of the invention. A filtering frequency adjusting device 610 includes a plurality of passive components PC1-PC4 and a switch 611. The passive components PC1-PC4 have commonly coupled first terminals, and are electrically connected to a conductive via VIA2. A plurality of second terminals of the passive components PC1-PC4 are respectively coupled to a plurality of terminals of the switch 611. The switch 611 further has another terminal coupled to a conductive via VIA1. The switch 611 further receives a plurality of sub-signals CT1 and CT2 of a control signal CTS, and selects one of the second terminals of the passive components PC1-PC4 to be coupled to the conductive via VIA1 according to the sub-signals CT1 and CT2. In the embodiment, the conductive via VIA1 may be electrically coupled to a first reference voltage terminal, and the conductive via VIA2 may be electrically coupled to a second reference voltage terminal. The first reference voltage terminal and the second reference voltage terminal may be two different terminals on the reference voltage layer of the circuit board.

In FIG. 6, the passive components PC1-PC4 may be a plurality of capacitors, respectively. In other embodiments of the invention, any one of the passive components PC1-PC4 may also be a resistor, an inductor, or a combination of at least two of a capacitor, a resistor, and an inductor, which is not limited by the invention.

In addition, in the embodiment, the number of the passive components PC1-PC4 may be more than four. Within an allowable layout range of the circuit board, the filtering frequency adjusting device 610 may include any number of the passive components. In addition, the number of the sub-signals CT1 and CT2 of the control signal CTS may be designed according to the number of the passive components PC1-PC4. If the number of the sub-signals CT1 and CT2 of the control signal CTS is N, the number of the passive components PC1-PC4 may be $2^N$ at most, and N is a positive integer.

In another aspect, the common mode filter of the embodiment of the invention may further include a controller 620. The controller 620 is coupled to the filtering frequency adjusting device 610, and is used to generate the sub-signals CT1 and CT2 of the control signal CTS. The controller 620 may generate the control signal CTS according to specification information or command information of the circuit board. The above-mentioned command information is issued by an external electronic device or a user.

According to the above description, through a switching operation of the passive components PC1-PC4 of the filtering frequency adjusting device 610, a passband of the common mode filter of the embodiment of the invention may be dynamically adjusted to improve the use efficiency of the common mode filter.

In terms of a hardware framework, the switch 611 may be constructed by using an antenna switch well known in the art. The controller 620 may be a processor with computing capability. Alternatively, the controller 620 may be a hardware circuit designed through a hardware description language (HDL) or any other digital circuit design method known to those with ordinary knowledge in the art, and implemented through a field programmable logic gate array (FPGA), a complex programmable logic device (CPLD), or an application-specific integrated circuit (ASIC).

Figure 7:
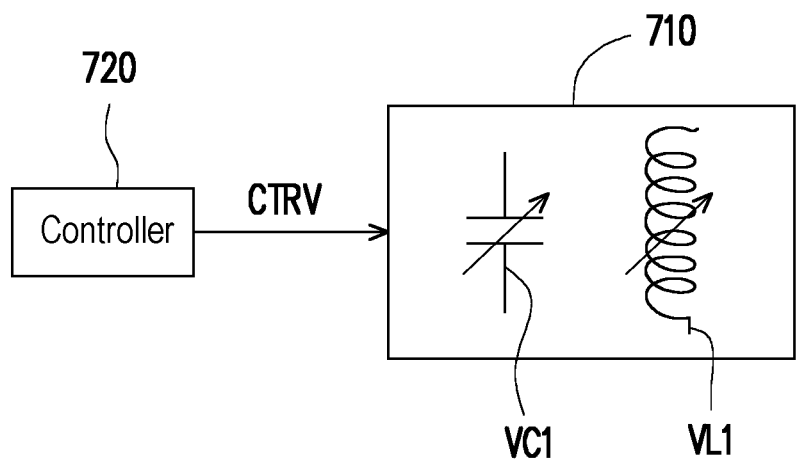
FIG. 7 is a schematic diagram of another implementation of a filtering frequency adjusting device of a common mode filter according to an embodiment of the invention.

Referring to FIG. 7 below, FIG. 7 is a schematic diagram of another implementation of a filtering frequency adjusting device of a common mode filter according to an embodiment of the invention. The filtering frequency adjusting device includes a variable capacitor VC1 and/or a variable inductor VL1. The common mode filter further includes a controller 720. The controller 720 is used to send a control voltage CTRV to the variable capacitor VC1 and/or the variable inductor VL1, and is used to adjust a capacitance value of the variable capacitor VC1 and/or adjust an inductance value of the variable inductor VL1. When the filtering frequency adjusting device has both of the variable capacitor VC1 and the variable inductor VL1 at the same time, the controller 720 may send different control voltages to respectively adjust the capacitance value of the variable capacitor VC1 and the inductance value of the variable inductor VL1. Different from the implementation of FIG. 6, the controller 720 of the embodiment may adjust the inductance and capacitance values provided by the filtering frequency adjusting device in an analog manner, and dynamically adjust the passband of the common mode filter to improve the use efficiency of the common mode filter.

In summary, in the common mode filter of the embodiment of the invention, the filtering frequency adjusting device is configured on the slot structure, and the equivalent impedance provided by the filtering frequency adjusting device is used to adjust the passband of the common mode filter to achieve impedance matching of the transmission wire. In this way, the reflection phenomenon generated in signal transmission may be effectively reduced to improve the signal quality. In addition, in the embodiment of the invention, by dynamically adjusting the equivalent impedance of the filtering frequency adjusting device, the adjustment operation of impedance matching may be completed without changing a layout design of the circuit board.

What is claimed is:

1. A common mode filter, disposed on a circuit board, and a signal layer of the circuit board having a differential signal wire pair, comprising:
   a slot structure, formed on a reference voltage layer of the circuit board, wherein the slot structure surrounds the differential signal wire pair; and
   a filtering frequency adjusting device, configured above a bent part of the slot structure, wherein the filtering frequency adjusting device comprises at least one of at least one inductor and at least one capacitor, and is disposed on the circuit board across the differential signal wire pair;
   wherein the filtering frequency adjusting device comprises:
      a plurality of passive components, having commonly coupled first terminals, and the first terminals of the passive components are coupled to a first reference voltage terminal; and
      a switch, coupled to a plurality of second terminals of the passive components, and selecting one of the second terminals of the passive components to be coupled to a second reference voltage terminal according to a control signal.

2. The common mode filter as claimed in claim 1, wherein two ends of the filtering frequency adjusting device are respectively coupled to the first reference voltage terminal and the second reference voltage terminal on the circuit board.

3. The common mode filter as claimed in claim 1, wherein each of the passive components is a capacitor or an inductor.

4. The common mode filter as claimed in claim 1, further comprising:
   a controller, coupled to the switch, and adapted to provide the control signal.

5. The common mode filter as claimed in claim 1, wherein the filtering frequency adjusting device comprises at least one of a variable capacitor and a variable inductor, a capacitance value of the variable capacitor and an inductance value of the variable inductor are respectively changed according to a first control voltage and a second control voltage.

6. The common mode filter as claimed in claim 1, wherein the filtering frequency adjusting device is detachably disposed on the circuit board.

7. A common mode filter, disposed on a circuit board, and a signal layer of the circuit board having a differential signal wire pair, comprising:
   a slot structure, formed on a reference voltage layer of the circuit board, wherein the slot structure surrounds the differential signal wire pair; and
   a filtering frequency adjusting device, configured above a bent part of the slot structure, wherein the filtering frequency adjusting device comprises at least one of at least one inductor and at least one capacitor, and is disposed on the circuit board across the differential signal wire pair;
   wherein the filtering frequency adjusting device comprises a first capacitor and a second capacitor, and the first capacitor and the second capacitor are coupled to each other.

8. A common mode filter, disposed on a circuit board, and a signal layer of the circuit board having a differential signal wire pair, comprising:
   a slot structure, formed on a reference voltage layer of the circuit board, wherein the slot structure surrounds the differential signal wire pair; and
   a filtering frequency adjusting device, configured above a bent part of the slot structure, wherein the filtering frequency adjusting device comprises at least one of at least one inductor and at least one capacitor, and is disposed on the circuit board across the differential signal wire pair;
   wherein the filtering frequency adjusting device comprises a first capacitor and a first inductor, and the first capacitor and the first inductor are coupled to each other.

9. A common mode filter, disposed on a circuit board, and a signal layer of the circuit board having a differential signal wire pair, comprising:

a slot structure, formed on a reference voltage layer of the circuit board, wherein the slot structure surrounds the differential signal wire pair; and a filtering frequency adjusting device, configured above a bent part of the slot structure, wherein the filtering frequency adjusting device comprises at least one of at least one inductor and at least one capacitor, and is disposed on the circuit board across the differential signal wire pair;

wherein the filtering frequency adjusting device comprises a first inductor and a second inductor, and the first inductor and the second inductor are coupled to each other.

\* \* \* \* \*